(12) United States Patent
Takeuchi

(10) Patent No.: US 6,383,895 B1
(45) Date of Patent: May 7, 2002

(54) METHOD OF FORMING A PLURALITY OF SEMICONDUCTOR DEVICES

(75) Inventor: Toshiharu Takeuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/678,309

(22) Filed: Oct. 3, 2000

(30) Foreign Application Priority Data

Oct. 4, 1999 (JP) .............................. 11-283072

(51) Int. Cl.⁷ ............................................. H01L 21/301
(52) U.S. Cl. ...................................................... 438/464
(58) Field of Search ............................... 438/462, 464, 438/461, 463, 113

(56) References Cited

U.S. PATENT DOCUMENTS 5,882,956 A * 3/1999 Umehara et al. ............ 438/113

FOREIGN PATENT DOCUMENTS

| JP | 06-349983 | 12/1994 |
|---|---|---|
| JP | 2762987 | 3/1998 |

* cited by examiner

Primary Examiner—Howard Weiss
Assistant Examiner—(Vikki) Hoa B. Trinh
(74) Attorney, Agent, or Firm—Foley & Lardner

(57) ABSTRACT

A plurality of semiconductor elements are formed at a predetermined interval on a surface of a GaAs substrate, and the semiconductor substrate is worked to a predetermined thickness. On the other hand, an aluminum nitride plate having a flat upper surface and a lower surface, where a plurality of grooves are formed on at an interval which is substantially the same as the interval between the semiconductor elements, is prepared. Next, the semiconductor substrate, a bonding resin, and the aluminum nitride plate are stacked so as to align positions of grooves with positions between the semiconductor elements. Then, the lower surface of the semiconductor substrate is adhered to the upper surface of the plate member using a bonding resin. The thus adhered body of the GaAs substrate and the aluminum nitride plate is broken along the grooves into a plurality of pellets, thereby manufacturing semiconductor devices.

11 Claims, 2 Drawing Sheets

METHOD OF FORMING A PLURALITY OF SEMICONDUCTOR DEVICES

BACKGROUND OF THE INVENTION

1. Field of the Invention

The present invention relates to a semiconductor device equipped with a heat sink and having a large amount of heat generation and a manufacturing method thereof, and more particularly, to a GaAs semiconductor device and a manufacturing method thereof.

2. Description of the Related Art

Semiconductor devices having a superior high frequency performance, for example, a Schottky gate field effect transistor (FET) using a III–V group semiconductor, such as GaAs, have been widely used in the fields of satellite communication, mobile communication, microwave base communication and the like. Accordingly, there has been a considerable demand for improvement of their performance.

For improvements of the high frequency performance and reliability, it is essential for those semiconductor devices to efficiently release heat generated due to an increase of the output power.

In particular, in the case of GaAs devices, suppression of the temperature increase of the element due to heat generation of the semiconductor element is an important key to realization of their full performance as well as a high reliability of the semiconductor device.

Also, because a temperature increase during the manufacturing process, such as mount process or the like, and during actual usage of the semiconductor device causes a stress to the GaAs element, a technique for alleviating such a temperature increase has been sought.

As such conventional technique, a heat sink having a thermal expansion coefficient substantially equal to that of the GaAs element is adhered to the GaAs element. However, there has been disclosed no methods, which realize this effect with mass production and at a low cost. Japanese Patent No. 2762987 discloses a technique for a semiconductor device in which, a heat sink made of a high thermal conductivity insulator having a thermal expansion coefficient which is substantially equal to that of the GaAs substrate is adhered to the back surface of the GaAs substrate. However, in this technique, after the high thermal conductivity insulator is adhered to the GaAs substrate, the GaAs substrate is cut together with the high thermal conductivity insulator to yield pieces of a pellet size. Accordingly, there is a drawback in which it requires a cumbersome cut-work, resulting in a low efficiency. Also, there is another drawback in which, because the high thermal conductivity insulator has a plate-like shape, its surface area is small, and a sufficient heat release performance cannot be achieved.

Further, Japanese Patent Laid-open Publication No. Hei6-349983 also discloses a technique in which a heat releasing plate (heat sink) is adhered to the back surface of the semiconductor wafer, and the semiconductor wafer is cut together with the heat releasing plate. However, this technique also has a drawback in which it requires a cumbersome cut-work, resulting in a low efficiency. Also, there is another drawback in which, because the high thermal conductivity insulator has a plate-like shape, its surface area is small, and a sufficient heat release performance cannot be achieved.

SUMMARY OF THE INVENTION

An object of the present invention is to provide a semiconductor device which is capable of preventing its performance degradation and generation of cracks in a semiconductor substrate, in particular, a GaAs substrate, which are caused by a stress accompanied by a temperature increase, and a manufacturing method thereof which is superior in mass productivity and low cost.

A manufacturing method of a semiconductor device according to the present invention comprises the steps of forming a plurality of semiconductor elements at a predetermined interval on a surface of a semiconductor substrate; working the semiconductor substrate to a predetermined thickness; preparing a plate member having a flat surface and a groove-shape surface, grooves being formed in the groove-shape surface at an interval which is substantially equal to the interval of the semiconductor elements; arranging the plate member and the semiconductor substrate so as to align positions between the semiconductor elements with the grooves; adhering the flat surface of the plate member to a surface of the semiconductor substrate on which the semiconductor elements are not formed; and breaking these adhered semiconductor substrate and the plate member along the grooves, thereby obtaining a plurality of semiconductor devices in which the plate member is adhered to the semiconductor substrate having the semiconductor element formed thereon.

In the present invention, the plate member, in which grooves are formed in advance at an interval which is substantially equal to the interval between the semiconductor elements, and the semiconductor substrate are arranged so as to align the positions between the semiconductor elements with the positions of the grooves, and they are adhered together using, for example, a bonding resin or an AuSn alloy. Then, by breaking the semiconductor substrate and the plate member together at the grooves, it becomes possible to manufacture the semiconductor devices equipped with a heat sink made of the plate member in mass production and at a low cost. The flatness of the flat surface of the plate member may be tolerated as long as the flatness does not cause problems upon adhering the plate member to the semiconductor substrate. Also, the positional relationship between the grooves and the semiconductor elements needs to be adjusted so as to prevent the cut-out faces of the semiconductor substrate from entering the interior of the semiconductor elements. Also, the interval of the grooves may be substantially equal to the interval of the semiconductor elements to the extent which enables the positional relationship between the grooves and the semiconductor elements to be maintained throughout the entire semiconductor substrate before breaking.

The semiconductor substrate is made of a III[\N]V group semiconductor, for example. In particular, it may be made of GaAs.

Also, it is preferable that the thermal expansion coefficient of the plate member is substantially equal to the thermal expansion coefficient of the semiconductor substrate. The plate member is formed of aluminum nitride, for example. By making the thermal expansion coefficient of the plate member substantially equal to the thermal expansion coefficient of the semiconductor substrate, generation of a stress due to a difference in thermal expansion coefficient can be suppressed, and deterioration of the performance of the semiconductor device and generation of cracks can be prevented. In particular, by using, as a heat sink, an aluminum nitride plate which has a thermal expansion coefficient of about 6 ppm/° C., which is consistent with the thermal expansion coefficient of the GaAs substrate, even when the semiconductor device is mounted on a base member which has a thermal expansion coefficient different from that of the GaAs substrate, the aluminum nitride plate functions as a cushioning material, thereby relaxing a stress the GaAs substrate receiving from the base member due to thermal expansion and thermal contraction.

A semiconductor device according to the present invention comprises a semiconductor element; a semiconductor substrate made of a III–V group material, the semiconductor element being formed on the semiconductor substrate; and a heat sink made of a plate member adhered to the semiconductor substrate, the thermal expansion coefficient of the plate member being substantially equal to the thermal expansion coefficient of the semiconductor substrate, wherein irregularity is formed in a surface of the plate member to which the semiconductor substrate is not adhered.

According to the present invention, a heat sink made of a plate member having a thermal expansion coefficient which is substantially equal to the thermal expansion coefficient of the semiconductor substrate is adhered to the III–V group semiconductor substrate. Accordingly, temperature elevation of the semiconductor device is suppressed, and the deterioration of the performance of the semiconductor device and the generation of cracks in the semiconductor device due to temperature elevation and thermal stresses can be prevented, thereby improving the performance and the reliability of the semiconductor device. Also, because irregularity is formed on a surface of the plate member which is not adhered to the semiconductor substrate, the surface area of the plate member can be made large and heat releasing performance can be improved.

The III–V group semiconductor substrate may be made of GaAs, for example. In that case, the plate member may be made of aluminum nitride, for example.

The nature, principle, and utility of the invention will become more apparent from the following detailed description when read in conjunction with the accompanying drawings in which like parts are designated by like reference numerals or characters.

DETAILED DESCRIPTION OF THE PREFERRED EMBODIMENTS

Figure 1A:
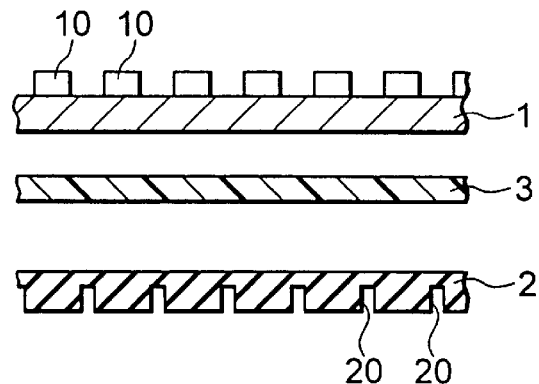
FIG. 1A is a cross-sectional view showing a manufacturing method of a semiconductor device according to an embodiment of the present invention.
Figure 1B:
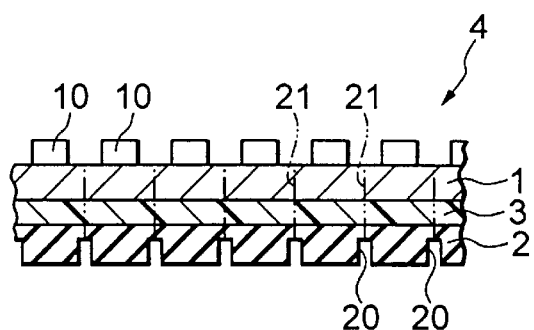
FIG. 1B is a cross-sectional view showing the manufacturing method of a semiconductor device according to the embodiment, which is the next step to the step shown in FIG. 1A.
Figure 1C:
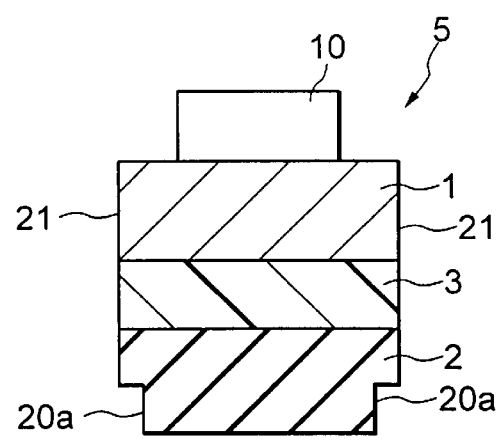
FIG. 1C is a cross-sectional view showing the manufacturing method of a semiconductor device according to the embodiment, which is the next step to the step shown in FIG. 1B.

The embodiments of the present invention will now be described below with reference to the accompanying drawings. FIGS. 1A to 1C are cross-sectional views showing a manufacturing method of a semiconductor device according to an embodiment of the present invention in the order of steps.

The semiconductor manufacturing method of the embodiment is now explained. First, as shown in the FIG. 1A, a plurality of semiconductor elements 10 are formed at a constant interval on the upper surface of a GaAs substrate 1, which is a semiconductor substrate. The semiconductor elements 10 may be arranged in the form of matrix, for example.

Next, the GaAs substrate 1, on which the plurality of semiconductor elements 10 have been formed, is worked to a predetermined thickness. The thickness is 20 to 80 $\mu$m, for example.

On the other hand, an aluminum nitride plate 2 having a flat upper surface and a lower surface, where a plurality of grooves 20 are formed on at an interval which is substantially the same as the interval between the semiconductor elements 10, is prepared. For example, when the semiconductor elements 10 are arranged in the matrix form, the grooves 20 also are formed so as to extend in the vertical and horizontal directions at the same pitch as that of the semiconductor elements 10, i.e., in a lattice manner.

Next, a bonding resin 3 is sandwiched between the GaAs substrate 1, which has been worked to the predetermined thickness, and the aluminum nitride plate 2 having the grooves 20 formed thereon.

Next, as shown in FIG. 1B, the semiconductor substrate 1, the bonding resin 3, and the aluminum nitride plate 2 are stacked So that the positions between the semiconductor elements 10 are aligned with the positions of the grooves 20. Then, by the bonding resin 3, the upper surface of the aluminum nitride plate 2 and the lower surface of the GaAs substrate 1 are adhered. This completes bonding of the GaAs substrate 1, which has been worked to the predetermined thickness, and the aluminum nitride plate 2 having the grooves 20 formed thereon.

Next, the adhered body 4 of the GaAs substrate 1 and the aluminum nitride plate 2 are broken along the grooves 20. The GaAs substrate 1 and the aluminum nitride plate 2 are thus cut at cutting faces 21 in the grooves 20. Accordingly, the GaAs substrate 1 is divided into pieces by every semiconductor element 10.

In this way, a plurality of pellets 5, as shown in FIG. 1C, are manufactured. The pellets 5 are the semiconductor devices according to this embodiment. In each of the pellets 5, a single semiconductor element 10 is provided on the GaAs substrate 1. Also, on the lower surface of the GaAs substrate 1, i.e., on a surface which does not have the semiconductor element 10 provided thereon, the aluminum nitride plate 2 is adhered via the bonding resin 3. On the lower surface of the aluminum nitride plate 2, the traces of the grooves 20 remain, forming notches (irregularity) 20a. The aluminum nitride plate 2 functions as a heat sink, which absorbs heat from the semiconductor element 10.

In this embodiment, by adhering the aluminum nitride plate 2, on which the grooves 20 have been formed in advance, to the GaAs substrate 1 having the semiconductor elements 10 formed thereon, and by breaking the aluminum nitride plate 2 and the GaAs substrate 1 together along the grooves 20, the semiconductor device equipped with a heat sink made of the aluminum nitride plate 2 can efficiently be manufactured at a low cost.

Also, since the semiconductor device of this embodiment is equipped with the heat sink made of the aluminum nitride plate 2, it can absorb the heat generated from the semiconductor element 10, thereby providing high performance and reliability. Since the traces of the grooves 20 remain on the lower surface of the aluminum nitride plate 2, these traces become notches (irregularity) 20a, thereby increasing the surface area of the aluminum nitride plate 2 and improving the heat releasing performance. Moreover, since the thermal expansion coefficient of the aluminum nitride plate 2 is substantially equal to the thermal coefficient of the GaAs substrate 1, the performance degradation of the semiconductor device (pellet 5) and generation of cracks within the semiconductor device due to a thermal stress accompanied by temperature changes can be prevented.

Figure 2:
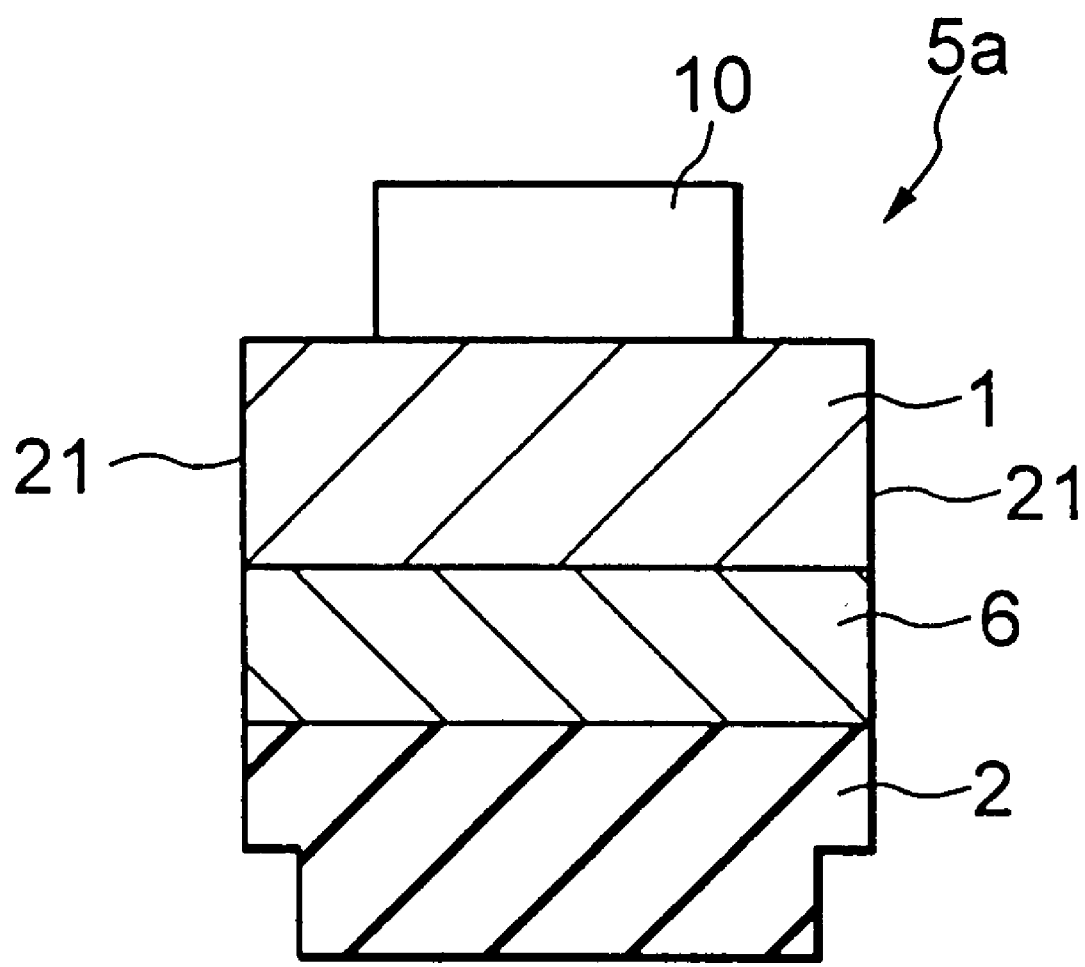
FIG. 2 is a cross-sectional view showing a semiconductor device according to another embodiment of the present invention.

Next, another embodiment of the present invention will be explained. FIG. 2 is a cross-sectional view showing a construction of a semiconductor device according to the another embodiment. In the embodiment shown in FIGS. 1A to 1C, the GaAs substrate 1 and the aluminum nitride plate 2 are adhered by the bonding resin 3, the another embodiment uses, instead of the bonding resin 3, an AuSn alloy plate 6 having a thickness of 1 to 10 μm to adhere the aluminum nitride plate 2 to the GaAs substrate 1.

Specifically, the AuSn alloy plate 6 having a thickness of 1 to 10 μm is sandwiched between the GaAs substrate 1 and the aluminum nitride plate 2, and the GaAs substrate 1, AuSn alloy plate 6, and the aluminum nitride plate 2 are stacked and heated to a temperature of 310 to 350° C. The AuSn alloy plate 6 accordingly is melted, and the GaAs substrate 1 and the aluminum nitride plate 2 are adhered each other by the melted and solidified AuSn alloy. Next, by breaking the GaAs substrate 1 and aluminum nitride plate 2, which have been adhered by the melted and solidified AuSn alloy, along the grooves 20, the semiconductor devices (pellets 5a) can be manufactured.

In each pellet 5a, a single semiconductor element 10 is provided on the GaAs substrate 1. Also, on the lower surface of the GaAs substrate 1, i.e., on a surface which does not have the semiconductor element 10 provided thereon, the aluminum nitride plate 2 is adhered to the GaAs substrate 1 via the AuSn alloy plate 6. On the lower surface of the aluminum nitride plate 2, the traces of the grooves 20 remain, forming notches (irregularity) 20a. The aluminum nitride plate 2 functions as a heat sink, which absorbs heat from the semiconductor element 10.

By this construction, as compared with the case where the bonding resin 3 is used, GaAs semiconductor devices which have even higher heat releasing characteristics can be manufactured.

While there has been described what are:at present considered to be preferred embodiments of the invention, it will be understood that various modifications may be made thereto, and it is intended that the appended claims cover all such modifications as fall within the true spirit and scope of the invention.

What is claimed is:

1. A manufacturing method of a semiconductor device, comprising the steps of:

forming a plurality of semiconductor elements at a predetermined interval on a surface of a semiconductor substrate made of a III–V group semiconductor;

working said semiconductor substrate to a predetermined thickness;

preparing a plate member having a flat surface and a groove-shape surface, grooves being formed in the groove-shape surface at an interval which is substantially equal to the interval of said semiconductor elements;

arranging said plate member and said semiconductor substrate so as to align positions between said semiconductor elements with said grooves;

adhering the flat surface of said plate member to a surface of said semiconductor substrate on which said semiconductor elements are not formed; and breaking these adhered semiconductor substrate and plate member along said grooves, thereby obtaining a plurality of semiconductor devices in which said plate member is adhered to said semiconductor substrate having said semiconductor element formed thereon.

2. The manufacturing method of a semiconductor device according to claim 1, wherein said III–V group semiconductor is GaAs.

3. The manufacturing method of a semiconductor device according to claim 1, wherein the thermal expansion coefficient of said plate member is substantially equal to the thermal expansion coefficient of said semiconductor substrate.

4. The manufacturing method of a semiconductor device according to claim 1, wherein said plate member is made of aluminum nitride.

5. The manufacturing method of a semiconductor device according to claim 1, wherein said plate member is used as a heat sink for said semiconductor device.

6. The manufacturing method of a semiconductor device according to claim 1, wherein said semiconductor device is a pellet having said semiconductor element.

7. The manufacturing method of a semiconductor device according to claim 1, wherein, said predetermined thickness is 20 to 80 μm.

8. The manufacturing method of a semiconductor device according to claim 1, wherein, before adhering the flat surface of said plate member to a surface of said semiconductor substrate on which said semiconductor elements are not formed, a resin is disposed between said semiconductor substrate and said plate member to adhere said semiconductor substrate to said plate member.

9. The manufacturing method of a semiconductor device according to claim 1, wherein, before adhering the flat surface of said plate member to a surface of said semiconductor substrate on which said semiconductor elements are not formed, an AuSn alloy is disposed between said semiconductor substrate and said plate member, and said AuSn alloy is heated to be fused for adhering said semiconductor substrate and said plate member.

10. The manufacturing method of a semiconductor device according to claim 9, wherein, the thickness of said AuSn alloy is 1 to 10 μm.

11. The manufacturing method of a semiconductor device according to claim 9, wherein the temperature of said heating is 310 to 350° C.

* * * * *